(12) United States Patent
Manakli et al.

(10) Patent No.: US 7,955,914 B2
(45) Date of Patent: Jun. 7, 2011

(54) METHOD OF PRODUCING AN ASYMMETRIC ARCHITECTURE SEMI-CONDUCTOR DEVICE

(75) Inventors: Serdar Manakli, Grenoble (FR); Jessy Bustos, Le Touvet (FR); Philippe Coronel, Barraux (FR); Laurent Pain, Saint Nicolas de Macherin (FR)

(73) Assignees: STMicroelectronics SA, Montrouge (FR); Commissariat a l'Energie Atomique, Paris (FR)

( * ) Notice: Subject to any disclaimer, the term of this patent is extended or adjusted under 35 U.S.C. 154(b) by 292 days.

(21) Appl. No.: 12/244,051

(22) Filed: Oct. 2, 2008

(65) Prior Publication Data

US 2009/0093079 A1     Apr. 9, 2009

(30) Foreign Application Priority Data

Oct. 2, 2007   (FR) .................................... 07 58018

(51) Int. Cl.
*H01L 21/00* (2006.01)
*H01L 21/336* (2006.01)

(52) U.S. Cl. ........ 438/157; 438/158; 438/269; 438/283; 257/347; 257/E21.415; 257/E27.112; 257/E29.275; 257/E29.277

(58) Field of Classification Search .................. 438/283, 438/157, 158, 269; 257/E21.415, E27.112, 257/E29.275, E29.277
See application file for complete search history.

(56) References Cited

U.S. PATENT DOCUMENTS

| | | | | |
|---|---|---|---|---|
| 4,315,984 A | | 2/1982 | Okazaki et al. | 430/296 |
| 4,557,995 A | * | 12/1985 | Broers et al. | 430/296 |
| 5,583,362 A | * | 12/1996 | Maegawa | 257/347 |
| 5,646,058 A | * | 7/1997 | Taur et al. | 438/283 |
| 6,455,227 B1 | * | 9/2002 | Hara | 430/273.1 |
| 6,495,403 B1 | * | 12/2002 | Skotnicki et al. | 438/157 |
| 6,946,377 B2 | * | 9/2005 | Chambers | 438/588 |
| 7,202,153 B2 | * | 4/2007 | Coronel et al. | 438/619 |
| 7,229,544 B2 | * | 6/2007 | Cohen | 205/118 |
| 2008/0084154 A1 | * | 4/2008 | Chun et al. | 313/491 |

FOREIGN PATENT DOCUMENTS

| | | |
|---|---|---|
| FR | 2693030 | 12/1993 |
| FR | 2858876 | 2/2005 |

OTHER PUBLICATIONS

Gillespie, S.J., "Linewidth Variation in E-Beam Technology," IBM Technical Disclosure Bulletin, vol. 25, No. 6, Nov. 1982, pp. 3107-3108.

(Continued)

*Primary Examiner* — Walter L Lindsay, Jr.
*Assistant Examiner* — Ron Pompey
(74) *Attorney, Agent, or Firm* — Lisa K. Jorgenson; Allen, Dyer, Doppelt, Milbrath & Gilchrist, P.A.

(57) ABSTRACT

A method is for producing an asymmetric architecture semi-conductor device. The device includes a substrate, and in stacked relation, a first photosensitive layer, a non-photosensitive layer, and a second photosensitive layer. The method includes a first step of exposing a first zone in each of the photosensitive layers by a first beam of electrons traversing the non-photosensitive layer. A second step includes exposing at least one second zone of one of the two photosensitive layers by a second beam of electrons or photons or ions, thereby producing a widening of one of the first zones compared to the other first zone such that the second zone is in part superimposed on one of the first zones.

32 Claims, 6 Drawing Sheets

OTHER PUBLICATIONS

Bandy, S.G., et al., "Submicron GaAs Microwave FET's With Low Parasitic Gate and Source Resistances," IEEE Electron Device Letters, vol. EDL-4, No. 2, Feb. 1983, pp. 42-22.

Bassous, E., et al., "Triple Layer System for High Resolution Microlithography," IBM Technical Disclosure Bulletin, vol. 25, No. 11B, Apr. 1983, pp. 5916-5917.

* cited by examiner

METHOD OF PRODUCING AN ASYMMETRIC ARCHITECTURE SEMI-CONDUCTOR DEVICE

FIELD OF THE INVENTION

This document concerns a method of producing an asymmetric semiconductor device having a 3D (three dimensional) architecture, and a method of producing an asymmetric self-aligned double gate, or surrounding gate, MOS (Metal Oxide Semiconductor) device.

BACKGROUND OF THE INVENTION

Known methods enable multiple gate MOS devices to be manufactured. The gates of these devices may, for example, be produced by etching, such as a junction etching or an isotropic etching.

Concerns with multiple gate architecture include the difficulty of production due to their three dimensional architecture. However, the production of doubles gates by etching poses difficulties, especially with regard to the alignment and the dimensional control of the gates, and due to the fact that the etching applies to the mask used. Certain difficulties also appear due to the reduction in the technological dimensions produced.

Optical lithography is also widely used in the production of semiconductor devices. But this technique may not be used in the production of self-aligned double gate devices because it may not enable patterns in depth in a material to be produced.

Lithography by electron beam, known as "E-Beam" lithography, represents an interesting technological alternative. Indeed, it enables the formation of patterns in depth in a material thanks to the depth of penetration of the electrons projected during the lithography.

Patent FR-A-2 858 876 proposes a self-aligned device produced by E-Beam lithography, represented in FIG. 1. In this solution, a localised zone is reproduced from an E-Beam lithography with a high voltage in order to be able to dissipate the electrons in the lower layers. In FIG. 1, an MOS transistor 1 is produced by E-Beam lithography. This transistor 1 comprises a source zone 2 and a drain zone 3. These two zones 2 and 3 are linked by a conducting bridge 4. The transistor 1 also comprises a double gate 5, 6, surrounding the conducting bridge 4. The two gates 5, 6 are self-aligned. Indeed, the two gates 5, 6 are produced during a single lithography step, by a same beam of electrons. Nevertheless, this may not enable a dimensional control in 3 dimensions since the two gates have the same CD (Critical Dimension), in other words the same width.

Recent studies have shown by simulations that dissymmetric gates can increase the performance levels of a transistor. FIG. 2 represents two MOS architectures 7a, 7b each comprising a source zone 10a, 10b and a drain zone 11a, 11b linked by a conducting bridge 12a, 12b. Each architecture 7a, 7b comprises a self-centred double gate 8a, 9a and 8b, 9b. In the first architecture 7a, the lower gate 9a is wider than the upper gate 8a, these two gates being centred with the middle of the conducting bridge 12a. In the second architecture 7b, the widths of the gates 8b, 9b are identical to those of the gates 8a, 9a. In this second architecture 7b, the upper gate 8b is not centred with the middle of the conducting bridge 12b but is offset from the side of the drain 11b or source 10b zone, the gates 8b and 9b in this example being self-centred towards the drain 11b. Simulations have made it possible to show that such structures enable saturation current, transconductance and gate capacity values, greater than the values obtained with, for example, a device such a that described in patent FR-A-2 858 876, to be obtained.

Thus there is a need to propose a method of producing an asymmetric, 3D architecture, semiconductor device enabling the three dimensions of the exposed zones to be controlled, and especially to command independently the widths of the exposed zones in several levels of the device. Also, there is a need to propose a production method that is rapid and compatible with the production constraints, particularly of a symmetric and/or asymmetric self-aligned double gate semiconductor device.

SUMMARY OF THE INVENTION

One embodiment proposes a method of producing an asymmetric architecture semiconductor device, the device comprising a substrate on which is arranged, in stacked relation, a first photosensitive layer, a non-photosensitive layer and a second photosensitive layer. The method comprises at least a first step of exposing a first zone in the photosensitive layers by a first beam of electrons traversing the non-photosensitive layer. A second step includes exposing at least one second zone of one of the two photosensitive layers by a second beam of electrons or photons or ions, the second zone being in part superimposed on one of the first zones. The second exposure step may thereby produce a widening of one of the first zones compared to the other first zone such that the second zone is in part superimposed on one of the first zones.

Thus, it is possible to lithograph zones in two superimposed photosensitive layers by choosing the width of the exposed zones in each of the photosensitive layers. It is then possible to produce, from the device obtained, semiconductor devices comprising asymmetric self-aligned doubles gates, such as MOS transistors.

Another embodiment concerns a method of producing an asymmetric 3D architecture semiconductor device, the device comprising a substrate on which is arranged, in stacked relation, at least one first photosensitive layer, at least one non-photosensitive layer, and at least one second photosensitive layer. The method comprises at least one first step of exposing a zone in each of the photosensitive layers by a first beam of electrons traversing the non-photosensitive layer, and at least one second step of exposing at least one of the two photosensitive layers by a second beam of electrons, thereby widening at least one exposed zone of one of the first or second photosensitive layers compared to the other exposed zone.

The first and/or the second photosensitive layer may be based on a photosensitive resin, for example of HSQ type.

When the exposure of the second zone is carried out by the second beam of electrons, the accelerating voltage of the first beam of electrons may be greater than the accelerating voltage of the second beam of electrons. The width of the first beam of electrons may be greater than the width of the second beam.

The number of electrons supplied in the first zones by the first beam of electrons and/or the number of electrons, or photons, or ions, supplied in the second zone by the second beam, may be adjusted as a function of the sensitivity of the first and/or the second photosensitive layer, for example by the duration of the exposure step of the first zones and/or the duration of the exposure step of the second zone.

The accelerating voltage of the first beam of electrons and/or, when the exposure of the second zone is carried out by the second beam of electrons or ions, the accelerating voltage of the second beam of electrons, may be adjusted as a function of the thickness of the first and/or the second photosensitive layers and/or the non-photosensitive layer.

The second zone may be produced in the first photosensitive layer, wherein the exposure of the second zone is carried out by the second beam of electrons. The number of electrons supplied by the second beam of electrons and/or the accelerating voltage and/or the width of the second beam of electrons may be adjusted so that the width of exposure of the second beam of electrons in the first photosensitive layer is greater than the width of exposure of the second beam of electrons in the second photosensitive layer.

The exposure step of the second zone may conserve the width of the first exposed zone in the second photosensitive layer. The second zone may be exposed in the second photosensitive layer. The exposure step of the second zone may conserve the width of the exposed zone in the first photosensitive layer.

When the exposure of the second zone is carried out by the second beam of electrons, the number of electrons supplied by the second beam of electrons and/or the accelerating voltage of the second beam of electrons may be adjusted so that exposure depth of the second beam of electrons is less than or equal to the thickness of the second photosensitive layer and the non-photosensitive layer.

The second beam may also expose a third zone in the photosensitive layer not comprising the second zone. The third zone may be in part superimposed on the first zone formed in the photosensitive layer not comprising the second zone. One of the second zone or the third zone formed in the first photosensitive layer may be of dimensions greater than the other of the second zone or the third zone.

The method may further comprise a third exposure step, carried out by a third beam of electrons or photons or ions, of at least one of the two photosensitive layers, widening at least one of the exposed zones.

When the third exposure step is carried out by the third beam of electrons, the accelerating voltage of the first beam of electrons may be greater than the accelerating voltage of the third beam of electrons. The width of the first beam of electrons may be greater than the width of the third beam.

The number of electrons, or photons, or ions, supplied by the third beam, and/or, when the third exposure step is carried out by the third beam of electrons, the accelerating voltage of the third beam of electrons may be adjusted as a function of the thickness and/or the sensitivity of the first and/or the second photosensitive layers.

The third beam may widen the exposed zone in the first photosensitive layer, and the third exposure step may then be carried out by the third beam of electrons, or the second photosensitive layer.

When the third exposure step is carried out by the third beam of electrons, the number of electrons supplied by the third beam of electrons and/or the accelerating voltage and/or the width of the third beam of electrons may be adjusted so that the width of exposure of the third beam of electrons in the first photosensitive layer is greater than the width of exposure of the third beam of electrons in the second photosensitive layer.

When the third exposure step is carried out by the third beam of electrons, the number of electrons supplied by the third beam of electrons and/or the accelerating voltage of the third beam of electrons may be adjusted so that the exposure depth of the third beam of electrons is less than or equal to the thickness of the second photosensitive layer and the non-photosensitive layer.

The third beam may widen the exposed zones in the two photosensitive layers, and the widening of the exposed zone in the first photosensitive layer may be greater than the widening of the exposed zone in the second photosensitive layer.

The width of the exposed zones in one of the photosensitive layers may be different to the width of the exposed zones in the other of the photosensitive layers. One of the exposed zones in each of the photosensitive layers may comprise one of their sides aligned vertically in relation to each other.

The exposed zones in the two photosensitive layers may be substantially centered vertically in relation to each other. The exposure steps may be repeated several times during the method, to form different exposed zones in the photosensitive layers, the number of beams used can vary depending on the exposed zones in the photosensitive layers.

The method may comprise at least one step of exposing a zone of identical width in each of the photosensitive layers by a beam of electrons traversing the non-photosensitive layer. The method may further comprise a step of etching the exposed zones or the non exposed zones depending on whether the material of the photosensitive layer is of positive or negative polarity, in at least one of the photosensitive layers. The photosensitive layers may be based on an organic or mineral resin, such as an HSQ resin, wherein the non-photosensitive layer may be at least based on a semiconductor, such as silicon, and/or a dielectric such as silicon oxide.

Another embodiment also concerns a method of producing an asymmetric, self-aligned double gate semiconductor device. The method may comprise producing at least one bridge in semiconductor, such as silicon, passing above at least one active zone of a substrate based on semiconductor, such as silicon and depositing at least one oxide layer, such as silicon oxide, at least around the bridge and on the active zone. The method may further include covering at least the bridge and filling at least one empty space between the active zone and the bridge of a photosensitive material, for example an organic resin such as a chemical amplification type resin based on PHS (Poly Hydroxy Stryrene) or mineral resin such as an HSQ resin, thereby forming at least one first and one second superimposed photosensitive layer.

Furthermore, the method may include exposing by at least one beam of electrons, for example by varying the accelerating voltage, at least one zone in each of the photosensitive layers, the zones being superimposed and placed above and below the bridge, according to the exposure steps described above. The exposed or non-exposed zones may be eliminated according to the polarity of the photosensitive material, positive or negative, of the photosensitive layers. At least the space previously occupied by the two exposed zones may be filled by a conductive material, thereby forming at least one asymmetric gate. The remaining material of the photosensitive layers may be eliminated. The empty spaces situated underneath the bridge on either side of the gate may be filled by an insulating material, for example of mineral type such as nitride.

Another embodiment also concerns an asymmetric, 3D architecture, semiconductor device produced according to one of the previous methods, comprising at least two zones exposed during exposure steps by beams of electrons. The widths of the exposed zones in the two photosensitive layers may be different. The exposed zones in the two photosensitive layers may each have one of their sides aligned vertically in relation to each other. The exposed zones in the two photosensitive layers may be substantially centered vertically in relation to each other. Finally, another embodiment also concerns an asymmetric self-aligned double gate MOS transistor produced according to the above described method.

BRIEF DESCRIPTION OF DRAWINGS

The present invention will be better understood on reading the description of embodiments given purely by way of indication and in no way limiting and by referring to the appended drawings in which.

Identical, similar or equivalent parts of the different figures described hereafter bear the same numerical references so as to facilitate going from one figure to the next. In order to make the figures clearer, the different parts represented therein are not necessarily to a uniform scale. The different possibilities (alternatives and embodiments) should be understood as not being exclusive of each other and may be combined together.

DETAILED DESCRIPTION OF THE PREFERRED EMBODIMENTS

Figure 1:
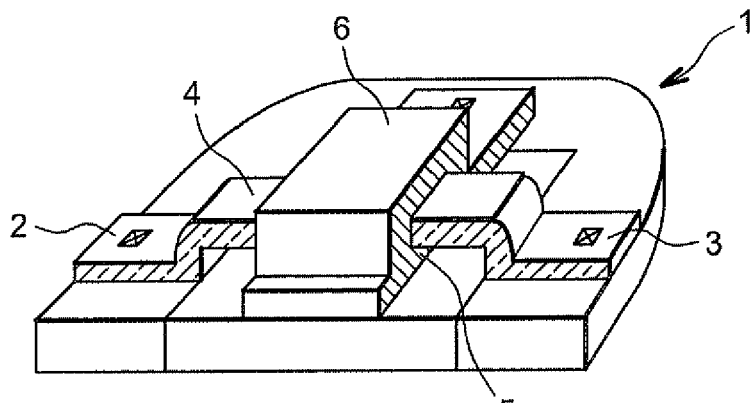
FIG. 1 represents a self-aligned double gate semiconductor device produced according to a method of the prior art.
Figure 2:
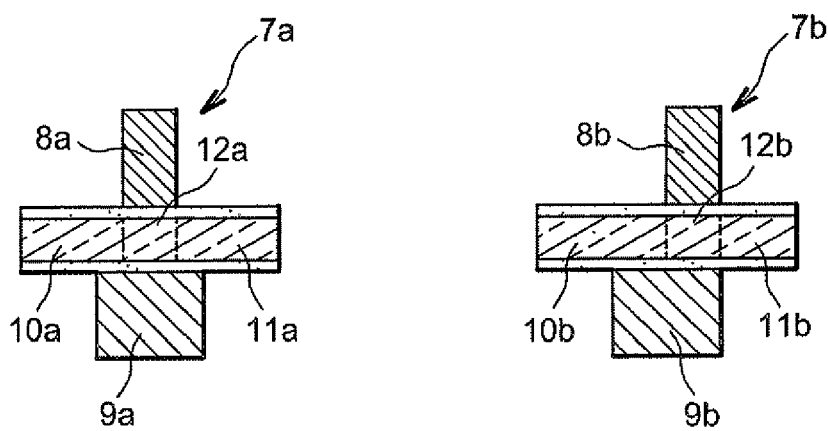
FIG. 2 represents a double gate semiconductor device of the prior art.
Figure 3:
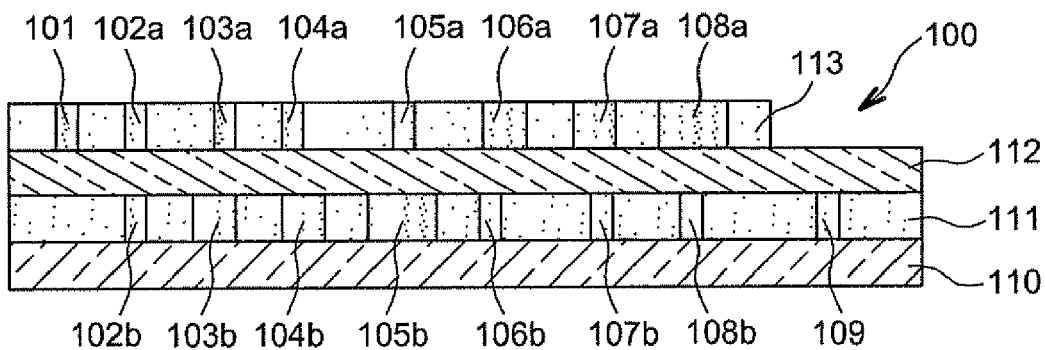
FIG. 3 represents an asymmetric 3D architecture semiconductor device produced according to a method of the present invention.

Reference will first be made to FIG. 3 which represents an asymmetric, 3D (three dimensional) architecture, semiconductor device 100 comprising exposed zones 101 to 109. The semiconductor device 100 comprises a substrate 110, for example based on semiconductor, such as silicon. A first photosensitive layer 111, for example based on resin, is arranged on the substrate 110. The resin used may be organic or mineral, such as for example HSQ (Hydrogen SilsesQuioxane) resin. When zones of the HSQ resin are exposed, they are transformed into an insulating material. In the case of a resin of negative polarity, the non exposed zones may then be etched selectively compared to the exposed zones. In the case of a positive resin, it is the exposed zones that may then be etched selectively.

A non-photosensitive layer 112 is arranged on the first layer of resin 111. This non-photosensitive layer 112 is, for example, produced based on a semiconductor, such as silicon, and/or a dielectric material, such as silicon oxide. A second photosensitive layer 113 is stacked on the non-photosensitive layer 112. This second layer 113 may, for example, be produced based on resin, organic or mineral, for example HSQ resin. The choice of materials (organic or mineral resin, polarity of the resin, etc.) depends on the type of device to be produced.

The device 100 is here asymmetric, that is to say the patterns 102b to 108b and 109 produced by the lithography steps in the first photosensitive layer 111 are different from the patterns 101 and 102a to 108a produced in the second photosensitive layer 113. The difference between two patterns superimposed one above the other may be a difference in the dimensions of patterns and/or alignment in relation to each other.

Figure 4A:
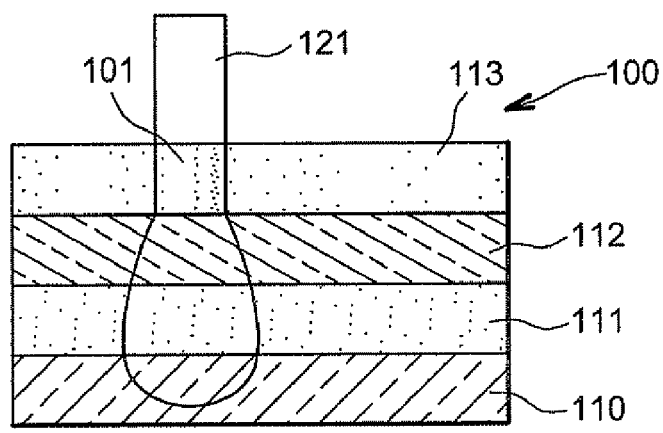
FIGS. 4A to 4E represent several lithography steps carried out during a method of the present invention.

Several lithography steps implemented during a method of producing the device 100 will now be described, in reference to FIGS. 4A to 4E. FIG. 4A represents a lithography step implemented for the production of the zone 101 of the device 100. One part of the device 100 is represented in FIG. 4A. The zone 101 is produced by a step of exposing the second layer of resin 113. This exposure may be carried out by an optic beam (also known as photonic beam or beam of photons), or by a beam of ions, for example a beam of protons, or even by a beam of electrons 121 as is the case in FIG. 4A. In the case of an exposure by beam of electrons 121, the dose of the beam of electrons 121, in other words the number of electrons supplied by the beam 121 in the first photosensitive layer 111, is here less than the sensitisation threshold of the material of the first photosensitive layer 111 so that this first photosensitive layer 111 is not exposed by the electrons of the beam 121, by choosing an adequate exposure time.

It is also possible that the accelerating voltage of the beam 121 is adjusted so that the exposure depth of the beam of electrons 121 may not reach the first photosensitive layer 111. This adjustment of the dose and/or the accelerating voltage of the beam of electrons 121 may also carried out as a function of the photosensitivity, or sensitivity, of the layers 111 and 113, as well as the thickness of one or several of the photosensitive layers 111 and 113 and/or the thickness of the non-photosensitive layer 112. Those skilled in the art will know how to define the thicknesses of the different layers as well as the dose and/or the accelerating voltage of the beam of electrons 121 enabling the zone 101 of the second photosensitive layer 113 to be exposed.

In the case of an exposure of the zone 101 by an optic beam, the size of the beam and/or the exposure time, and the number of photons found in the zone 101 after the exposure step, are chosen as a function of the parameters of the zone 101 to be produced.

Figure 4B:
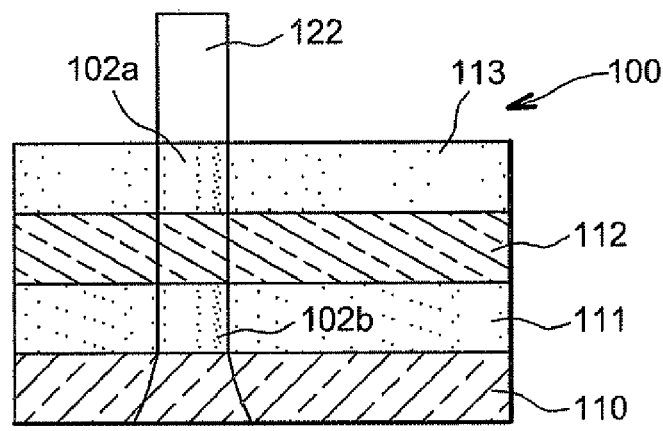

The exposure of the two zones 102a, 102b of the device 100 is then carried out, as is represented in FIG. 4B. This exposure is here carried out by a single beam of electrons 122. The dose and/or the accelerating voltage of the beam of electrons 122 are sufficiently high to expose both the zone 102a in the second photosensitive layer 113, traverse the non-photosensitive layer 112, and expose the zone 102b in the first photosensitive layer 111.

The beam of electrons 122 has an accelerating voltage greater than that of the beam of electrons 121 of FIG. 4A and/or a dose of electrons adapted to the levels of photosensitivity of the layers 111 and 113, for example obtained by an exposure time greater than the exposure time of the zone 101. Given that the zones 102a, 102b are created by a single beam of electrons 122, they have a width substantially similar to each other and corresponding to the width of the beam 122, and are self-aligned, the respective edges of the zones 102a, 102b being substantially aligned one above the other, and centered one above the other.

Figure 4C:
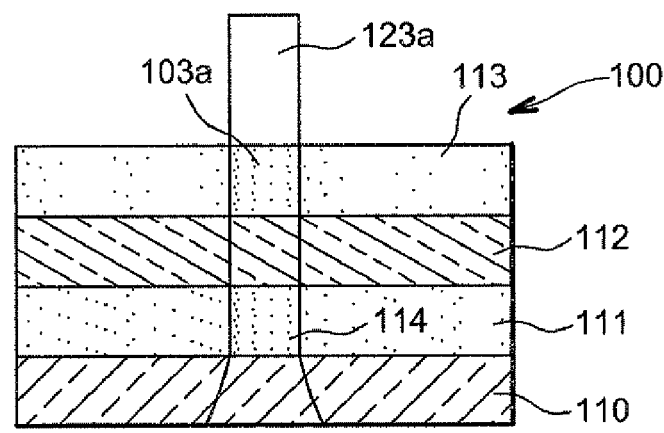
Figure 4D:
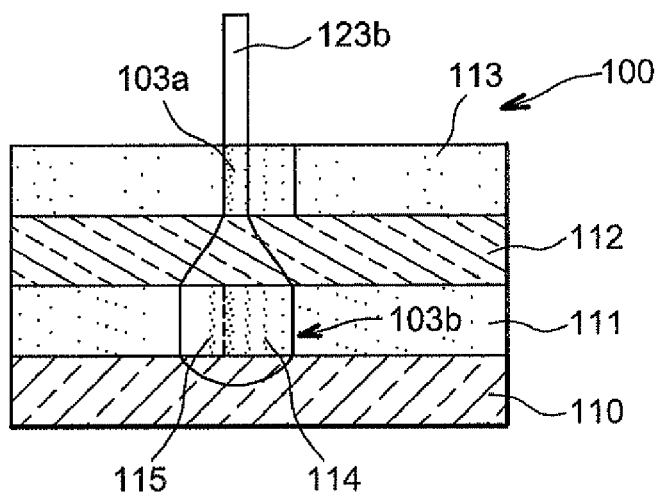

The exposure of two zones 103a, 103b of the device 100 is then carried out, as is represented in FIGS. 4C and 4D. Here, the exposure of photosensitive layers 111 and 113 is carried out in two steps. The first exposure step, represented in FIG. 4C, includes exposing the first zones 103a and 114, respectively in the second and first photosensitive layers 113 and 111 by a first beam of electrons 123a traversing the non-photosensitive layer 112. This exposure step is similar to the exposure carried out to form the zones 102a and 102b. The zones 103a and 114 each have, after the first exposure step, a substantially similar width and are self-aligned and centred one above the other. The term width is interpreted according to the sectional view illustrated: the exposed zones have a shape in the plane parallel to the support, and the two exposed zones of same "width" are such that their shape is substantially superimposable perpendicularly to this plane.

A second exposure step is then carried out, represented in FIG. 4D. This second exposure step is carried out by a second beam of electrons 123b. This second beam of electrons 123b has an accelerating voltage adjusted so that the second beam 123b has a different shape in the first photosensitive layer 111 and in the second photosensitive layer 113, and thereby obtain an electron diffusion "pear", the section of which is wider at the level of layer 111 than at the level of layer 113. The exposure time is also adapted so that the number of electrons injected into the photosensitive layers enables such an exposure, depending on the levels of photosensitivity of the layers 111 and 113. This second beam of electrons 123b passes through a left part of the exposed zone 103a of the second photosensitive layer 113. In FIG. 4D, it may be seen that this second beam of electrons 123b makes it possible to expose a second zone 115 wider in the first photosensitive layer 111 than the exposed zone in the second photosensitive layer 113.

This second zone 115 is in part superimposed on the first zone 114 produced in the layer 111. Thus, the exposed zone 103b is produced (formed by the zones 114 and 115) in the first photosensitive layer without widening the exposed zone 103a in the second photosensitive layer 113. The accelerating voltage of the first beam of electrons 123a is greater than that of the second beam of electrons 123b. The number of electrons introduced into the zones 103a, 115 by the second beam 123b may also be less than the number of electrons introduced into these zones 103a, 114 by the first beam 123a. In addition, the first beam of electrons 123a is here wider than the second beam of electrons 123b at the level of the first photosensitive layer 111 in order to "widen" the zone 114 only in one direction thanks to the second zone 115.

The zone 103a in the second layer of resin 113 is therefore uniquely created by the first beam 123a, the second beam 123b cooperating with the first beam 123a for the exposure of the zone 103b in the first photosensitive layer 111. Two exposure zones 103a and 103b of different width, and self-aligned, are thereby obtained, in other words they are superimposed at the level of the thinnest zone. In the present case, the exposed zones 103a, 103b have one of their sides, the right side in FIG. 4D, aligned vertically with each other. Once again, those skilled in the art will know how to adjust the dose, the width and the accelerating voltage of the beams of electrons 123a and 123b in relation to the desired dimensions of the exposed zones 103a and 103b, in other words to the design of the circuit, and the characteristics (thickness and sensitivity) of the layers to be exposed 111 and 113.

In an alternative, it is possible to inverse these two exposure steps, by producing firstly a part of the zone 103a and the zone 115 by the second beam 123b, then forming the zone 103a and the zone 114 by the first beam of electrons 123a.

The two zones 104a and 104b of the device 100 are also produced by two exposure steps. The exposure beams used may be substantially similar to those used for the exposure of zones 103a, 103b, represented in FIGS. 4C and 4D. Compared to the exposure of the zones 103a and 103b, a second beam of electrons, for example similar to the second beam of electrons 123b described previously, passes through a right part of the exposed zone 104a in the second photosensitive layer 113, thereby forming the two self-aligned exposed zones 104a, 104b of different widths, in which the left sides of each of the zones are aligned vertically with each other. Once again, the exposure step by the second beam 123b may be carried out before the exposure step by the first beam 123a.

Figure 4E:
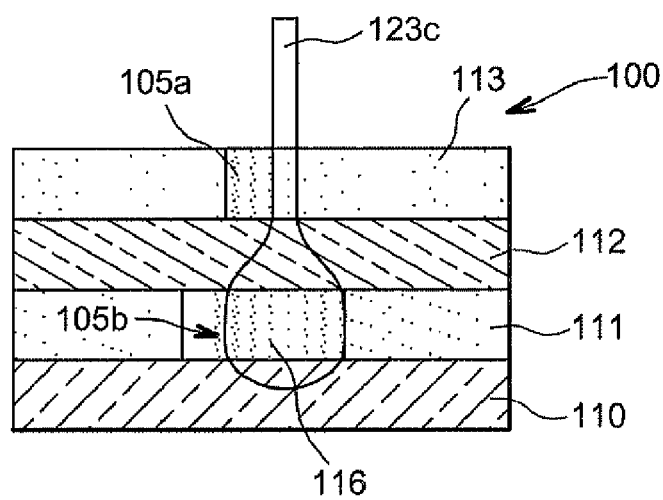

For the production of the zones 105a and 105b, three exposure steps are implemented. The two first steps may for example be similar to the two exposure steps carried out for the production of the zones 103a, 103b or the zones 104a and 104b, by using the two beams 123a and 123b represented in FIGS. 4C and 4D. In the example of FIG. 4E, two exposure steps similar to those carried out to produce the zones 103a and 103b are used to produce in part the zones 105a and 105b. A third exposure step carried out by a third beam of electrons 123c enables the exposed zone 105b to be widened by exposing a third zone 116, in the first photosensitive layer 111. This third beam 123c passes through a right part of the first exposed zone 105a of the second photosensitive layer 113, without widening the zone 105a. The accelerating voltage of the first beam 123a is greater than that of the second beam 123b and the third beam 123c.

The dose of the second beam of electrons 123b may be substantially similar to the dose of the third beam of electrons 123c. In addition, the first beam 123a is here wider than the second beam 123b and the third beam 123c. Two exposed zones 105a and 105b of different width, self-aligned and centred vertically with each other are here thereby obtained. The adjustments of the doses, acceleration voltages and widths of the first, second and third beams of electrons 123a, 123b and 123c are adjusted as a function of the thickness of the different layers 111, 112 and 113 and the sensitivity of the photosensitive layers 111 and 113. Once again, the order of the three exposure steps may be different to that explained above.

In FIG. 3, the device 100 also comprises zones 106a and 106b exposed in each of the photosensitive layers 113 and 111. Here, the exposed zone 106a in the second photosensitive layer 113 is wider than the exposed zone 106b in the first photosensitive layer 111. In addition, these two zones 106 each have their left side aligned vertically in relation to each other. To achieve this, an exposure of the zone 106b and a part of the zone 106a is carried out by a beam of electrons for example similar to the beam 123a represented in FIG. 4C. These first exposed zones then have the same width and are self-aligned in relation to each other.

A second exposure step by a second beam of electrons is then carried out, for example similar to the beam of electrons 121 represented in FIG. 4A, or by a beam of photons or ions, thereby enabling the zone 106a to be widened by exposing a second zone in the second photosensitive layer 113 without modifying the width of the zone 106b of the first photosensitive layer 111. This second beam widens the zone 106a by the right side. The order of carrying out these two exposure steps may be reversed compared to the above description.

The zones 107a and 107b are produced in a similar manner to the zones 106a and 106b, except for the widening of the zone 107a, which is carried out on the left side by the second beam during the second exposure step.

The zones 108a and 108b are produced firstly by two exposure steps, for example, similar to those carried out for the production of zones 106a and 106b or zones 107a and 107b. A third beam of electrons, photons or ions will be used to widen the zone 108a by exposing a third zone in the second photosensitive layer 113, so that the widening produced on the left side is similar to the widening produced on the right side.

Finally, a final exposure step of the device 100 enables the zone 109 in the first photosensitive layer 111 to be exposed. At the level of this zone 109, the second photosensitive layer 113 has been removed beforehand by an etching. To bring about this exposure, a unique beam of electrons is used. The dose and/or the exposure time and/or the accelerating voltage of the beam 124 are high enough to be able to traverse the non-photosensitive layer 112 and form the zone 109 in the first photosensitive layer 111, in other words attain the sensitivity threshold of the first layer 111.

The configuration of the exposed zones on the device 100 is one example of configuration. It is entirely possible to expose a completely different number of zones on a semiconductor device, in different positions.

It is also possible that the device 100 comprises more than two photosensitive layers and/or one non-photosensitive layer.

This production method makes it possible to combine optic or ionic exposures with exposures by beams of electrons and may be easily carried out. Indeed, optical lithography offers a time saving difficult to obtain with lithography by beams of electrons. On the other hand, lithography by beams of electrons makes it possible to obtain a more precise exposure and above all a possibility of being able to control the 3 dimensions of the exposure carried out, by exposing for example only the new zones found in the buried zones. It is therefore aimed, in the production of a semiconductor device comprising for example MOS transistors, at optimizing the different lithography steps by producing the non-critical parts of the device by optical and/or ionic lithography, and the parts requiring a high resolution and/or a dimensioning in depth, for example for the production of asymmetric double gates, by lithography by beams of electrons. It is also possible to take into account other criteria such as the alignment of gates between the transistors as well as the dimensional control on the dissymmetry of the devices.

Figure 5A:
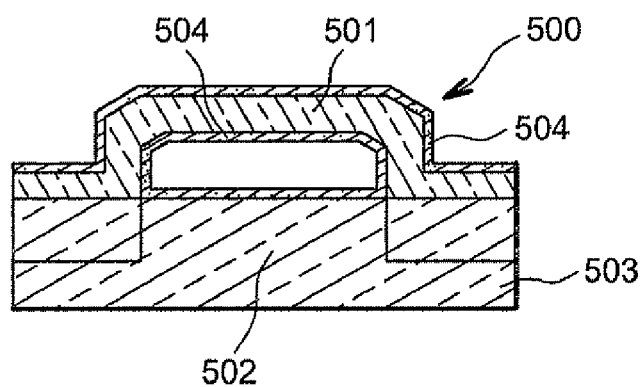
FIGS. 5A to 5G represent the steps of a method of producing an asymmetric self-aligned double gate semiconductor device, in accordance with the present invention.
Figure 5B:
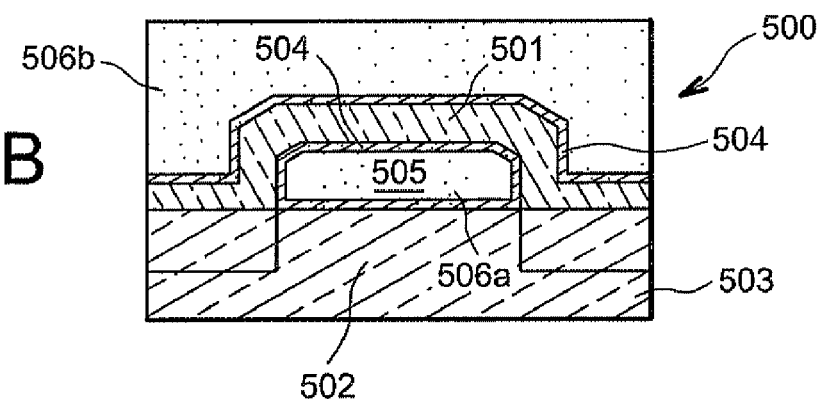
Figure 5C:
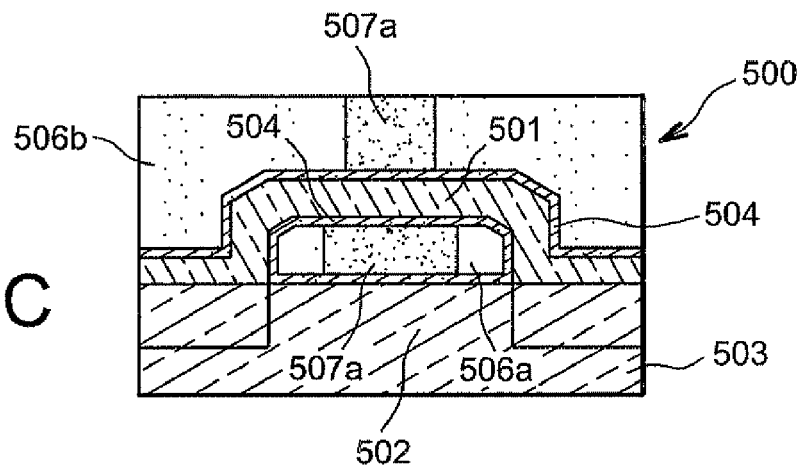

FIGS. 5A to 5G represent different steps of a method of producing an asymmetric self-aligned double gate semiconductor device 500. To do this, a bridge in semiconductor 501, for example in silicon, passing above an active zone 502 of a semiconductor substrate 503 is produced, as is represented in FIG. 5A. An oxide layer 504, for example of silicon oxide, is deposited around the bridge 501 and on the active zone 502. One then covers the whole of the structure, in other words here the bridge 501, and an empty space 505 between the active zone 502 and the bridge 501 is filled with a photosensitive resin, thereby forming a first layer 506a and a second layer 506b of photosensitive resin, as is represented in FIG. 5B. At least two zones 507a and 507b of the resin layer 506a, 506b of different width, superimposed and placed above and below the bridge 501, are produced by lithography steps, for example those described previously for the production of zones 105a and 105b of the device 100, as represented in FIG. 5C.

Figure 5D:
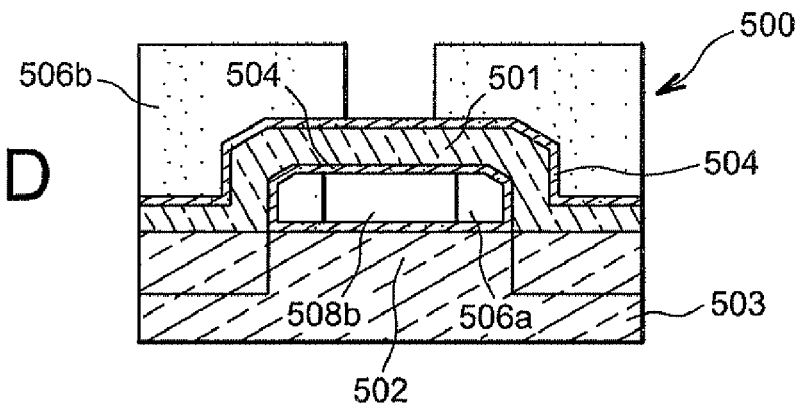
Figure 5E:
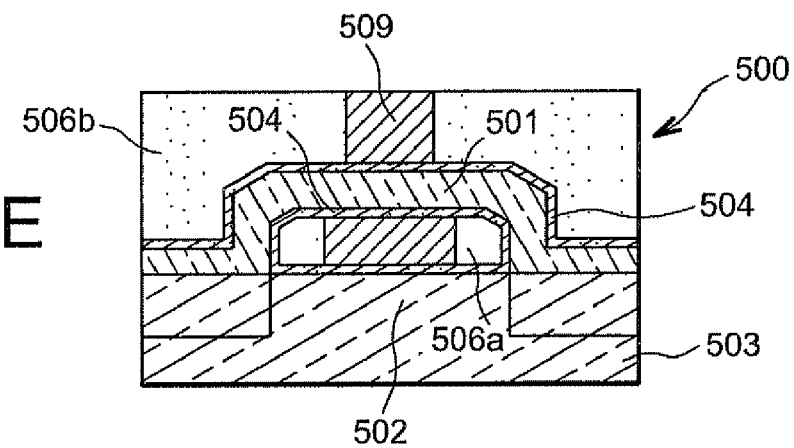
Figure 5F:
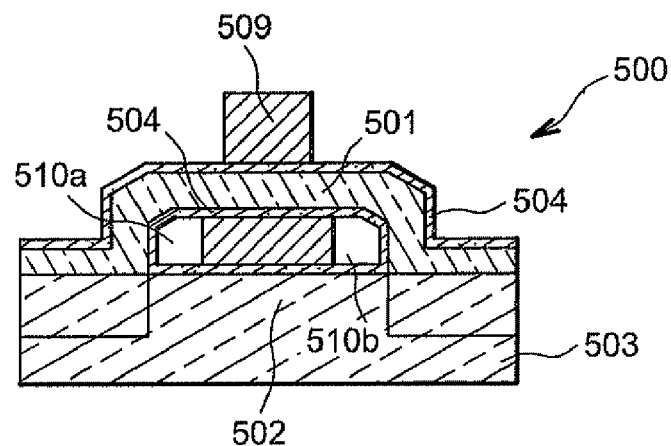
Figure 5G:
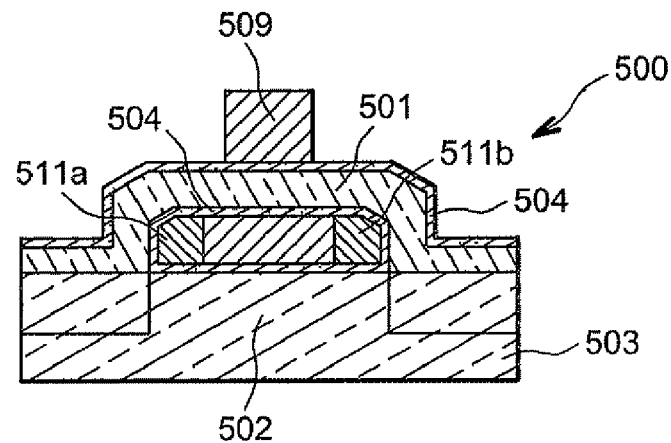

In FIG. 5D, the two exposed zones 507a and 507b are eliminated, for example by etching of the resin layer 506a, 506b, thereby creating two empty space zones 508a and 508b. The empty space zones 508a and 508b are then filled by a conductive material, such as a metal, thereby forming an asymmetric self-aligned double gate 509, represented in FIG. 5E. The remaining resin layer 506a, 506b is then eliminated, as represented in FIG. 5F. Finally, empty spaces 510a and 510b, situated underneath the bridge 501, on either side of the gate 509, are filled by nitride, thereby forming spacers 511a and 511b. The device 500 thereby produced may for example be an asymmetric self-aligned double gate MOS transistor.

In an alternative embodiment, it is possible to conserve the remaining portions of the resin layer 506a, 506b after the production of the empty spaces 508a and 508b, especially in the case of a negative resin 506a, 506b where the remaining portions would be transformed into insulating material. The integration of such a device would then be carried out at a temperature below the flow temperature of the resin.

The exposed zones may be produced in a positive photosensitive material, the exposed zones then being eliminated. It is also possible to use a negative photosensitive material. In this case, it is the non exposed zones that are then eliminated.

Figure 6:
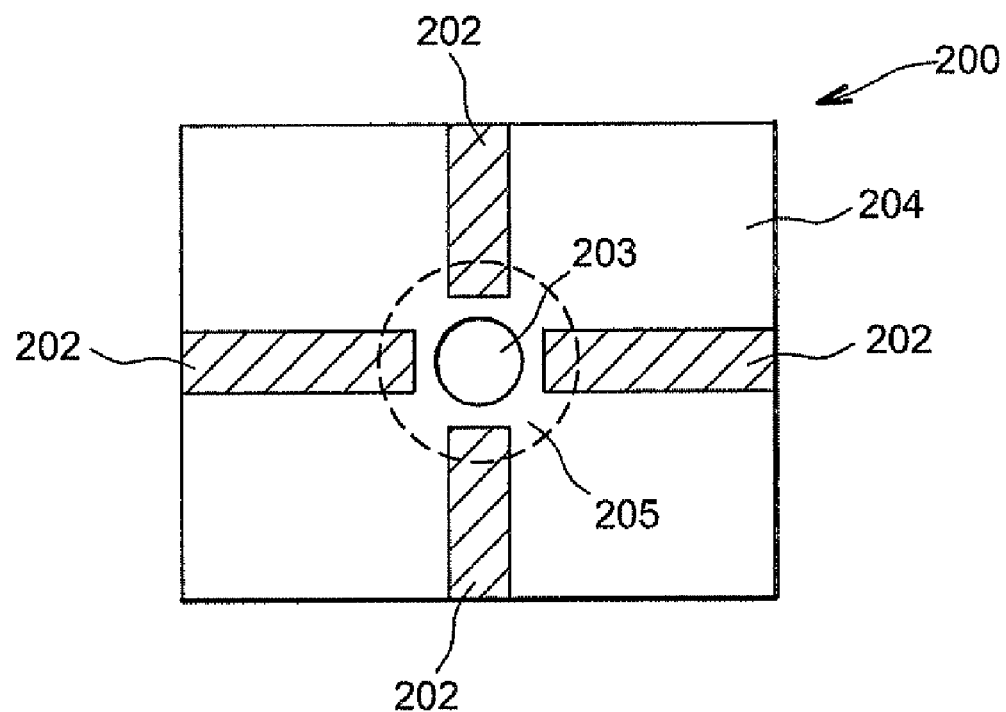
FIGS. 6 and 7 represent one example of structure produced by a method of producing an asymmetric architecture semiconductor device, according to the present invention.
Figure 7:
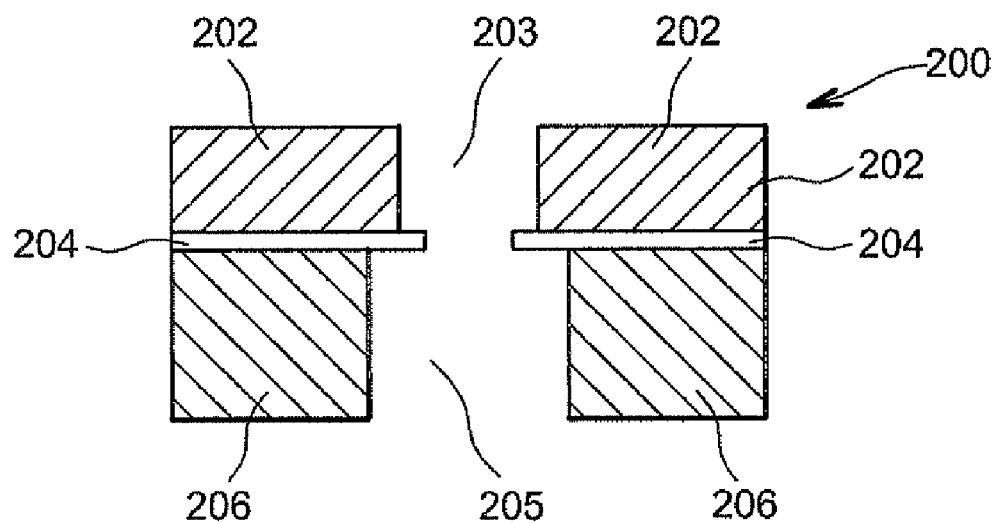

FIGS. 6 and 7 represent one example of structure 200 that can be produced by the lithography steps of the method described previously. FIG. 6 is a top view of the structure 200, FIG. 7 being a sectional view of this structure 200.

The structure 200 comprises a first level 202 formed here of four elements of rectangular parallelepiped shape. These four elements come from a first layer of photosensitive resin. The structure 200 also comprises a layer 204 for example based on a semiconductor and/or a dielectric, and a second layer 206 also based on photosensitive resin. As is represented in FIGS. 6 and 7, two empty zones 203 and 205 of substantially circular shape have been produced, for example by a first lithography step with a first beam of electrons to form the first exposed zones in the first and second layers of resin, these first zones being of substantially similar dimensions, then by a second lithography step carried out with a second beam of electrons widening the exposed zone uniquely in the second layer of resin and not in the first layer of resin. The zones 203, 205 thereby formed are asymmetric in relation to each other. This type of mechanical structure 200 offers a good stability and may for example serve as basis for the production of a SIP (System In Package).

That which is claimed:

1. A method of producing an asymmetric semiconductor device comprising a substrate and a first photosensitive layer, a non-photosensitive layer, and a second photosensitive layer arranged on the substrate in stacked relation, the method comprising:
   exposing a respective first zone in each of the first and second photosensitive layers to a first beam traversing the non-photosensitive layer; and
   exposing at least one second zone of one of the first and second photosensitive layers to a second beam to widen one of the first zones compared to the other first zone such that the at least one second zone is in part superimposed on one of the first zones.

2. The method according to claim 1 wherein the second beam comprises at least one of an electrons beam, a photon beam, and an ion beam.

3. The method according to claim 1, wherein the first and second beams comprise electron beams; and wherein an accelerating voltage of the first electron beam is greater than an accelerating voltage of the second electron beam.

4. The method according to claim 1, wherein a width of the first beam is greater than a width of the second beam.

5. The method according to claim 1, wherein the first beam comprises an electron beam; and wherein a number of electrons supplied to each of the first zones by the first beam is adjusted as a function of a sensitivity of at least one of the first and the second photosensitive layers.

6. The method according to claim 1, wherein the second beam comprises an electron beam; and wherein a number of electrons supplied to the second zone by the second beam is adjusted as a function of a sensitivity of at least one of the first and the second photosensitive layers.

7. The method according to claim 1, wherein the first beam comprises an electron beam; and wherein a number of electrons supplied to each of the first zones by the first beam is adjusted as a function of a duration of the exposure.

8. The method according to claim 1, wherein the second beam comprises an electron beam; and wherein a number of electrons supplied to the second zone by the second beam is adjusted as a function of a duration of the exposure.

9. The method according to claim 1, wherein an accelerating voltage of the first beam is adjusted as a function of a thickness of at least one of the first photosensitive layer, the second photosensitive layer, and the non-photosensitive layer.

10. The method according to claim 1, wherein the second beam comprises an electron beam; and wherein an accelerating voltage of the second beam is adjusted as a function of a thickness of at least one of the first photosensitive layer, the second photosensitive layer, and the non-photosensitive layer.

11. The method according to claim 1, wherein the second beam comprises an electron beam; and wherein the second zone is produced in the first photosensitive layer.

12. The method according to claim 11, wherein at least one of the number of electrons supplied by the second beam, an accelerating voltage of the second beam, and a width of the second beam is adjusted so that a width of exposure of the second beam in the first photosensitive layer is greater than a width of exposure of the second beam in the second photosensitive layer.

13. The method according to claim 11, wherein at least one of a number of electrons supplied by the second beam and an accelerating voltage of the second beam is adjusted so that an exposure depth of the second beam is at most equal to a thickness of the second photosensitive layer and the non-photosensitive layer.

14. The method according to claim 1, wherein the second beam also exposes a third zone in the first photosensitive layer, the third zone being in part superimposed on the first zone; and wherein one of the second zone and the third zone has at least one dimension being greater a dimension of an other of the second zone and the third zone.

15. The method according to claim 1, further comprising exposing at least one of the first and second photosensitive layers to a third beam to thereby widen at least one of the first and second zones.

16. The method according to claim 15, wherein the third beam comprises an electron beam; and wherein an accelerating voltage of the first beam is greater than an accelerating voltage of the third beam.

17. The method according to claim 15, wherein a width of the first beam is greater than a width of the third beam.

18. The method according to claim 15, wherein the third beam comprises an electron beam; and wherein a number of electrons supplied by the third beam is adjusted as a function of at least one of a thickness and a sensitivity of at least one of the first and the second photosensitive layers.

19. The method according to claim 15, wherein an accelerating voltage of the third beam is adjusted as a function of at least one of a thickness and a sensitivity of at least one of the first and the second photosensitive layers.

20. The method according to claim 15, wherein the third beam widens the first zone of the first photosensitive layer.

21. The method according to claim 15, wherein the third beam comprises an electron beam; and wherein at least one of number of electrons supplied by the third beam, an accelerating voltage of the third beam, and a width of the third beam is adjusted so that a width of exposure of the third beam in the first photosensitive layer is greater than a width of exposure of the third beam in the second photosensitive layer.

22. The method according to claim 15, wherein the third beam widens the first zone of the second photosensitive layer.

23. The method according to claim 22, wherein the third beam comprises an electron beam; and wherein at least one of a number of electrons supplied by the third beam and an accelerating voltage of the third beam is adjusted so that an exposure depth of the third beam is at most equal to a thickness of the second photosensitive layer and the non-photosensitive layer.

24. The method according to claim 15 wherein the third beam widens each of the first zones; and wherein the widening of the first zone of the first photosensitive layer is greater than the widening of the first zone of the second photosensitive layer.

25. The method according to claim 1, wherein a width of one first zone is different than a width of the other first zone.

26. The method according to claim 1, further comprising exposing at least one zone of identical width in each of the first and second photosensitive layers to a fourth beam, comprising an electron beam, traversing the non-photosensitive layer.

27. The method according to claim 1, further comprising etching at least one of the respective first zones of the first and second photosensitive layers based upon a polarity of that photosensitive layer.

28. A method of producing an asymmetric self-aligned double gate semiconductor device comprising:
    producing at least one bridge on a semiconductor substrate above at least one active zone of the semiconductor substrate;
    depositing at least one oxide layer adjacent the bridge and on the at least one active zone;
    covering the bridge and filling at least one empty space between the at least one active zone and the bridge with a photosensitive material to thereby form at least one first and at least one second superimposed photosensitive layer;
    exposing a respective first zone in each of the first and second photosensitive layers to a first beam traversing the non-photosensitive layer;
    exposing at least one second zone of one of the first and second photosensitive layers to a second beam to widen one of the first zones compared to the other first zone such that the at least one second zone is in part superimposed on one of the first zones;
    removing at least one of an exposed and a non-exposed zone based upon a polarity of the photosensitive layer;
    filling a removed zone with a conductive material to thereby form at least one asymmetric gate;
    removing remaining material of the photosensitive layers; and
    filling empty spaces situated underneath the bridge on either side of the gate with an insulating material.

29. The method according to claim 28, wherein an accelerating voltage of the first beam is greater than an accelerating voltage of the second beam.

30. The method according to claim 28, wherein a width of the first beam is greater than a width of the second beam.

31. The method according to claim 28, wherein the first beam comprises an electron beam; and wherein a number of electrons supplied to each of the first zones by the first beam is adjusted as a function of a sensitivity of at least one of the first and the second photosensitive layers.

32. The method of claim 28, wherein the insulating material comprises a nitride.

* * * * *

UNITED STATES PATENT AND TRADEMARK OFFICE
CERTIFICATE OF CORRECTION

PATENT NO. : 7,955,914 B2
APPLICATION NO. : 12/244051
DATED : June 7, 2011
INVENTOR(S) : Manakli et al.

It is certified that error appears in the above-identified patent and that said Letters Patent is hereby corrected as shown below:

Front Page, Title        Delete: "SEMI-CONDUCTOR"
                         Insert: --SEMICONDUCTOR--

Column 1, Line 3         Delete: "SEMI-CONDUCTOR"
                         Insert: --SEMICONDUCTOR--

Column 1, Line 58        Delete: "centred"
                         Insert: --centered--

Column 3, Line 64        Delete: "self-centred"
                         Insert: --self-centered--

Column 2, Line 1         Delete: "such a"
                         Insert: --such as--

Column 4, Line 4         Delete: "to"
                         Insert: --from--

Column 4, Line 19        Delete: "non exposed"
                         Insert: --non-exposed--

Column 4, Line 31        Delete: "on semiconductor"
                         Insert: --on a semiconductor--

Column 5, Line 37        Delete: "on semiconductor"
                         Insert: --on a semiconductor--

Column 6, Line 19        Delete: "also carried"
                         Insert: --also be carried--

Signed and Sealed this
Twentieth Day of September, 2011

David J. Kappos
*Director of the United States Patent and Trademark Office*

CERTIFICATE OF CORRECTION (continued)
U.S. Pat. No. 7,955,914 B2

| | |
|---|---|
| Column 8, Line 18 | Delete: "centred" |
| | Insert: --centered-- |
| | |
| Column 8, Line 24 | Delete: "to" |
| | Insert: --from-- |
| | |
| Column 8, Line 66 | Delete: "words attain" |
| | Insert: --words to attain-- |
| | |
| Column 10, Line 22 | Delete: "as basis" |
| | Insert: --as the basis-- |